(12) United States Patent  
Seko et al.

(10) Patent No.: US 9,219,021 B2  
(45) Date of Patent: Dec. 22, 2015

(54) SEMICONDUCTOR DEVICE INCLUDING HEAT DISSIPATING STRUCTURE

(71) Applicant: PANASONIC CORPORATION, Osaka (JP)

(72) Inventors: Koichi Seko, Osaka (JP); Katsumi Otani, Osaka (JP); Katsuyoshi Matsumoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/558,638

(22) Filed: Dec. 2, 2014

(65) Prior Publication Data

US 2015/0084180 A1  Mar. 26, 2015

Related U.S. Application Data

(63) Continuation of application No. PCT/JP2013/001104, filed on Feb. 26, 2013.

(30) Foreign Application Priority Data

Jul. 30, 2012  (JP) ................................ 2012-168335

(51) Int. Cl.  
*H01L 23/367* (2006.01)  
*H01L 23/433* (2006.01)  
(Continued)

(52) U.S. Cl.  
CPC ........ *H01L 23/3675* (2013.01); *H01L 23/3142* (2013.01); *H01L 23/3677* (2013.01); *H01L 23/4334* (2013.01); *H01L 23/5384* (2013.01); *H01L 23/5386* (2013.01); *H01L 23/552* (2013.01); *H01L 24/16* (2013.01); *H01L 24/48* (2013.01); *H01L 25/0655* (2013.01); *H01L 23/3121* (2013.01); *H01L 23/49816* (2013.01);  
(Continued)

(58) Field of Classification Search  
CPC ............. H01L 23/552; H01L 23/3675; H01L 23/5384; H01L 23/4334; H01L 24/16; H01L 24/48; H01L 25/0655  
See application file for complete search history.

(56) References Cited

U.S. PATENT DOCUMENTS 5,483,098 A    1/1996  Joiner, Jr.  
6,909,178 B2 *  6/2005  Sakamoto et al. ............ 257/725  
(Continued)

FOREIGN PATENT DOCUMENTS

JP    2003-007910 A    1/2003  
JP    2004-071961 A    3/2004  
(Continued)

OTHER PUBLICATIONS

International Search Report issued in International Application No. PCT/JP2013/001104 dated May 21, 2013.

*Primary Examiner* — William Coleman  
(74) *Attorney, Agent, or Firm* — McDermott Will & Emery LLP

(57) ABSTRACT

A semiconductor device includes a substrate serving as a base and having a surface on which electrodes are provided, a semiconductor chip mounted to the surface of the substrate, a sealing portion sealing the semiconductor chip and the surface of the substrate, first vias each penetrating the sealing portion in a thickness direction of the sealing portion to reach the electrodes on the surface of the substrate, external terminals connected to the first vias, and second vias provided near the semiconductor chip, extending to such a depth that the second vias do not penetrate the sealing portion, and insulated from the substrate and the semiconductor chip.

20 Claims, 13 Drawing Sheets

(51) Int. Cl.
*H01L 23/538* (2006.01)
*H01L 23/552* (2006.01)
*H01L 23/00* (2006.01)
*H01L 25/065* (2006.01)
*H01L 23/31* (2006.01)
*H01L 23/498* (2006.01)

(52) U.S. Cl.
CPC .......... *H01L 23/49838* (2013.01); *H01L 24/45* (2013.01); *H01L 24/49* (2013.01); *H01L 24/73* (2013.01); *H01L 2223/6677* (2013.01); *H01L 2224/1626* (2013.01); *H01L 2224/16225* (2013.01); *H01L 2224/45144* (2013.01); *H01L 2224/45147* (2013.01); *H01L 2224/4826* (2013.01); *H01L 2224/48091* (2013.01); *H01L 2224/48227* (2013.01); *H01L 2224/49175* (2013.01); *H01L 2224/73253* (2013.01); *H01L 2924/15321* (2013.01); *H01L 2924/15787* (2013.01); *H01L 2924/18161* (2013.01); *H01L 2924/19105* (2013.01); *H01L 2924/19106* (2013.01); *H01L 2924/3025* (2013.01)

(56) References Cited

U.S. PATENT DOCUMENTS

| | | | |
|---|---|---|---|
| 7,511,299 B1* | 3/2009 | Alexander et al. | 257/48 |
| 2002/0185718 A1* | 12/2002 | Mikubo et al. | 257/678 |
| 2009/0184412 A1 | 7/2009 | Yasunaga | |
| 2010/0230805 A1 | 9/2010 | Refai-Ahmed | |
| 2011/0163428 A1* | 7/2011 | Galera et al. | 257/675 |

FOREIGN PATENT DOCUMENTS

| | | | | |
|---|---|---|---|---|
| JP | 2005-322659 | * | 11/2005 | ......... H01L 21/56 |
| JP | 2006-032773 A | | 2/2006 | |
| JP | 2007-281160 A | | 10/2007 | |
| JP | 2009-170802 A | | 7/2009 | |

* cited by examiner

SEMICONDUCTOR DEVICE INCLUDING HEAT DISSIPATING STRUCTURE

CROSS-REFERENCE TO RELATED APPLICATIONS

This is a continuation of International Application No. PCT/JP2013/001104 filed on Feb. 26, 2013, which claims priority to Japanese Patent Application No. 2012-168335 filed on Jul. 30, 2012. The entire disclosures of these applications are incorporated by reference herein.

BACKGROUND

The present disclosure relates to semiconductor devices including heat dissipating structures, in particular to a semiconductor device including a semiconductor chip packaged on a base with resin sealing.

In recent years, with a higher integration density of integrated circuits on a semiconductor chip and a higher processing speed, the amount of heat generation from the semiconductor chip has been increased. In order to prevent malfunction or abnormal operation due to such heat from a semiconductor chip, the importance of a heat dissipating structure in the semiconductor device increases.

Japanese Unexamined Patent Publication No. 2003-7910 describes a semiconductor device as illustrated in FIG. 15A in which a back surface of a semiconductor chip 107 mounted to a substrate 1 is polished together with a ball 108a and a sealing portion 3, so that the back surface is exposed to dissipate heat generated from the substrate 1 and the semiconductor chip 107. Alternatively, as illustrated in FIG. 15B, substrate via holes 134 are formed in the semiconductor chip 107 mounted to the substrate 1, and balls 124 exposed from the sealing portion 3 are in contact with the back surface of the semiconductor chip 107, so that heat from the semiconductor chip 107 is efficiently dissipated.

SUMMARY

However, in the semiconductor device of Japanese Unexamined Patent Publication No. 2003-7910 illustrated in FIG. 15A, the sealing portion is polished together with the substrate and the ball. Therefore, due to stress during polishing, cracks may be formed in the substrate, the balls, and the sealing portion, or the substrate, the ball, and the sealing portion may be detached from each other at the interface therebetween. Thus, manufacturing and reliability problems may arise. Exposing the semiconductor chip by polishing the sealing portion protecting the semiconductor chip results in a reliability problem where resistance to stress during secondary packaging and water resistance are reduced.

In assembling the semiconductor device of Japanese Unexamined Patent Publication No. 2003-7910 illustrated in FIG. 15B, a terminal made of a hard material such as metal is externally brought into contact with a pad on the back surface of the semiconductor chip. Therefore, stress is applied to the semiconductor chip and a peripheral structure of the semiconductor chip. This may lead to the reliability problem. The semiconductor chip is structured such that a pad connected to the ball exposed from the sealing portion is provided on the back surface of the semiconductor chip, and the pad is further connected to a through via extending from an element surface to the back surface of the semiconductor chip. With this structure, the through via restricts a region of the element surface of the semiconductor chip on which elements are arranged, so that the area of the semiconductor chip is increased. Additionally, the through via also restricts the layout design of the interior of the semiconductor chip, which may also produce undesirable results including an increase in interconnection delay.

Therefore, the present disclosure is generally directed to a structure capable of improving heat dissipation of a semiconductor device without deteriorating the reliability and the performance of the semiconductor device. The present disclosure is also directed to a heat dissipating structure which does not restrict the design of the semiconductor chip and has a high degree of freedom so that an arrangement pattern is freely changed depending on heat generation.

A first semiconductor device of the present disclosure includes: a base having a first surface, a second surface opposite to the first surface, and electrodes on the first surface; a first semiconductor chip mounted to the first surface of the base; a sealing portion sealing the first semiconductor chip and the first surface of the base; a plurality of first vias penetrating the sealing portion from a surface of the sealing portion in a thickness direction of the sealing portion and each electrically connected to a corresponding one of the electrodes on the first surface of the base; a plurality of first external terminals provided on the surface of the sealing portion and each connected to a corresponding one of the first vias; a plurality of second vias located inwardly from the first vias and extending from the surface of the sealing portion in the thickness direction of the sealing portion to such a depth that the second vias do not penetrate the sealing portion; and a plurality of second external terminals provided on the surface of the sealing portion and each connected to a corresponding one of the second vias; wherein the second vias are not in contact with the first semiconductor chip.

According to the semiconductor device of the present disclosure, the second vias are arranged in the periphery of the semiconductor chip which is a heat source, in particular, near the side surface of the semiconductor chip. Thus, heat from the heat source (the semiconductor chip) is efficiently transferred in the sealing portion to thermal conductors (the vias). Therefore, the heat dissipation can be improved. The heat conducting path extending from the second vias to the external terminals is perpendicular to the principal surface of the base and is thus the shortest path to the outside of the semiconductor device. Therefore, heat can be efficiently dissipated also in the case of the semiconductor device in which a semiconductor chip is packaged by resin sealing.

The semiconductor chip is protected by the sealing portion, and the heat conducting path for heat dissipation is in contact with neither the substrate nor the semiconductor chip. Thus, the heat dissipation can be improved without deteriorating the reliability or the performance of the semiconductor device.

The second vias do not penetrate the sealing portion and are thus insulated from the first substrate. Thus, it is no longer necessary to provide an electrode on the surface of the first substrate to connect the via, so that the heat dissipation can be improved without limiting the design of the semiconductor chip. The depth of each second via can be adjusted such that the second via reaches neither the semiconductor chip nor the substrate. Thus, the second vias can be arranged almost anywhere in the sealing portion, so that the heat dissipating structure having a high degree of freedom depending on heat generated from the semiconductor chip is possible.

A semiconductor device assembly of the present disclosure includes: a mounting substrate having a surface on which a wiring pattern is formed, wherein the first external terminals and the second external terminals of the first semiconductor device are electrically connected to electrodes of the mounting substrate, the electrodes being fixed at a constant electric potential.

According to the semiconductor device assembly of the present disclosure, release of electric noise generated from the semiconductor chip to lateral sides of the semiconductor device can be reduced, and noise from the mounting substrate and the outside of the semiconductor device is reduced, so that the semiconductor chip can be stably operated.

According to the present disclosure, a resin sealed semiconductor device whose reliability and performance are not deteriorated can be provided with the heat dissipation being improved.

BRIEF DESCRIPTION OF THE DRAWINGS

FIGS. 1A and 1B show a configuration of a semiconductor device according to a first embodiment, wherein FIG. 1A is a cross-sectional view taken along the line Ia-Ia of FIG. 1B, and FIG. 1B is a plan view.

FIGS. 2A and 2B show a configuration of a semiconductor device according to a first variation of the first embodiment, wherein FIG. 2A is a cross-sectional view taken along the line IIa-IIa of FIG. 2B, and FIG. 2B is a plan view.

FIGS. 3A and 3B show a configuration of a semiconductor device according to a second variation of the first embodiment, wherein FIG. 3A is a cross-sectional view taken along the line IIIa-IIIa of FIG. 3B, and FIG. 3B is a plan view.

FIGS. 4A and 4B show a configuration of a semiconductor device according to a third variation of the first embodiment, wherein FIG. 4A is a cross-sectional view taken along the line IVa-Iva of FIG. 4B, and FIG. 4B is a plan view.

FIGS. 7A and 7B show a configuration of a semiconductor device of a third embodiment, wherein FIG. 7A is a cross-sectional view taken along the line VIIa-VIIa of FIG. 7B, and FIG. 7B is a plan view.

FIG. 8B is a plan view.

FIGS. 12A and 12B are views illustrating a configuration of a semiconductor device according to a sixth embodiment, wherein FIG. 12A is a cross-sectional view taken along the line XIIa-XIIa of FIG. 12B, and FIG. 12B is a plan view.

FIGS. 13A and 13B are views illustrating a configuration of a semiconductor device according to a variation of the sixth embodiment, wherein FIG. 13A is a cross-sectional view taken along the line XIIIa-XIIIa of FIG. 13B, and FIG. 13B is a plan view.

DETAILED DESCRIPTION

The semiconductor device and the electronic component of the present disclosure will be described with reference to the drawings.

First Embodiment

Figure 1A:
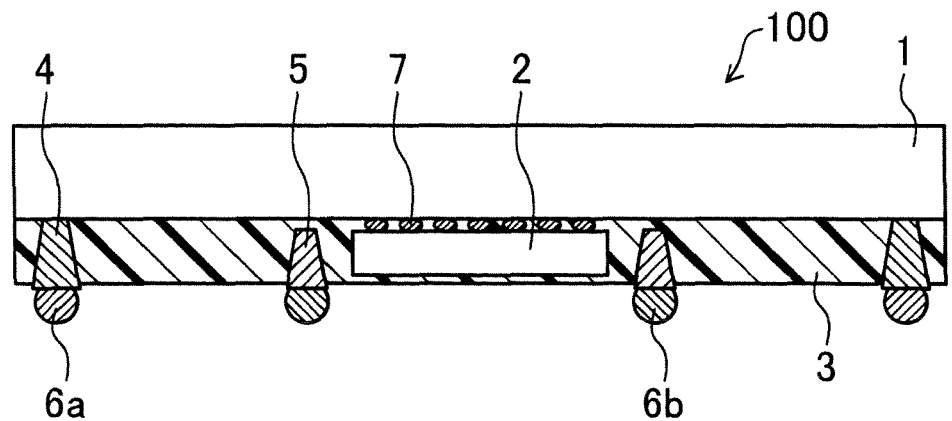
Figure 1B:
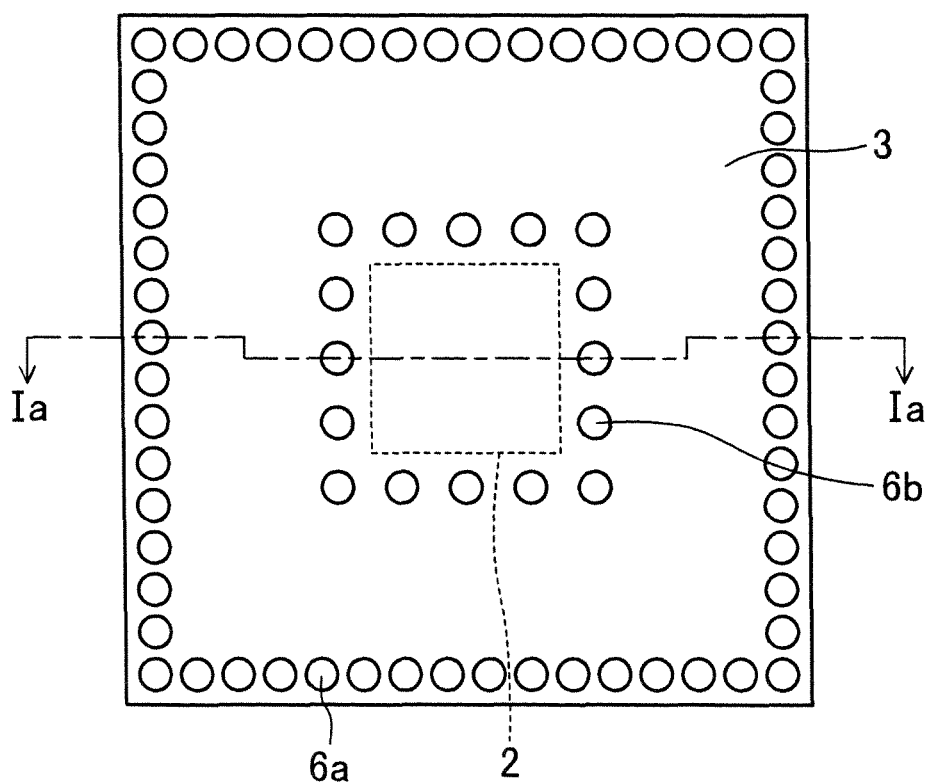

FIGS. 1A and 1B are respectively a cross-sectional view and a plan view schematically illustrating a semiconductor device according to the present embodiment.

A semiconductor device 100 illustrated in FIG. 1A includes a substrate 1, a semiconductor chip 2 mounted to an upper surface of the substrate 1, a sealing portion 3 sealing the upper surface of the substrate 1 and the semiconductor chip 2, first vias 4 penetrating the sealing portion 3 in a thickness direction of the sealing portion 3, second vias 5 extending in the thickness direction of the sealing portion 3, external terminals 6a connected to the first vias 4, and external terminals 6b connected to the second vias 5.

On the upper surface of the substrate 1, a wiring pattern (not shown) is formed. The wiring pattern includes electrodes (not shown) electrically connected to the semiconductor chip and the first vias 4. It is sufficient that the substrate 1 serves as a base to which a semiconductor chip will be mounted. The substrate 1 is not limited to a circuit board and may be a lead frame.

The semiconductor chip 2 is flip-chip mounted to the upper surface of the substrate 1 via a plurality of bumps 7. A principal surface of the semiconductor chip 2, that is, a surface on which the bumps 7 are bonded, has an active region in which an integrated circuit including a transistor, a capacitor, etc. is formed.

The sealing portion 3 covers the semiconductor chip 2 and is provided on the upper surface of the substrate 1. The sealing portion 3 is an insulator such as a resin.

Through holes extending in the thickness direction of the sealing portion 3 from the electrode on the upper surface of the substrate 1 to an upper surface of the sealing portion 3 are formed in the sealing portion 3. The through holes are filled with a conductive substance, thereby forming the first vias 4. On the surface of the sealing portion 3 opposite to the substrate 1, the external terminals 6a are arranged to be in contact with the first vias 4. That is, one end of each first via 4 is connected to the electrode on the upper surface of the substrate 1, and the other end is connected to a corresponding one of the external terminals 6a exposed from the sealing portion 3. Through this electric pathway, the function of the semiconductor chip 2 is utilized from outside of the semiconductor device 100.

Recessed portions are formed in the sealing portion 3 at positions located outwardly from (outside) the semiconductor chip 2, in particular, near a side surface of the semiconductor chip 2. The recessed portions extend in the thickness direction of the sealing portion 3 to such a depth that the recessed portions do not reach the wiring pattern on the substrate 1. The recessed portions having such a depth that the recessed portion do not reach the wiring pattern on the substrate 1 are filled with a conductive substance, thereby forming the second vias 5. The second vias 5 are in contact with neither the substrate 1 nor the semiconductor chip 2. The second vias 5 are insulated from the substrate 1 and the semiconductor chip 2. On the surface of the sealing portion 3, the external terminals 6b are arranged to be in contact with the second vias 5. Heat generated from the semiconductor chip 2 is dissipated through a heat conducting paths formed by the second vias 5 formed near the side surface of the semiconductor chip 2 and the external terminals 6b to the outside of the semiconductor device 100.

At least either of the first vias 4 or the second vias 5 may be structured such that a metal thin film is formed on an inner surface of the through holes or the recessed portions.

The semiconductor device 100 is mounted to a mounting substrate (not shown) via the external terminals 6a, 6b to obtain an assembly. Heat generated from the semiconductor chip 2 is transferred to the mounting substrate of the assembly mainly via the second vias 5 and the external terminals 6b, so that the heat is dissipated to the outside of the semiconductor device 100.

On an upper surface of the semiconductor device 100 illustrated in FIG. 1B, the external terminals 6a, 6b are arranged on the surface of the sealing portion 3. The external terminals 6b are arranged at positions located outwardly from the semiconductor chip 2, preferably, near the semiconductor chip 2 to surround the semiconductor chip 2. The external terminals 6a are arranged outside the external terminals 6b. The external terminals 6a may be arranged in an outer edge region of the semiconductor device 100. Each of the external terminals 6a is connected to a corresponding one of the first vias 4 in the sealing portion 3, and each of the external terminals 6b is connected to a corresponding one of the second vias 5 in the sealing portion 3.

With this configuration, the second vias 5 are arranged in the periphery of the semiconductor chip 2 serving as a heat source, in particular, near the side surface of the semiconductor chip 2. Thus, heat from the heat source (the semiconductor chip) is efficiently transferred to thermal conductors (the vias) in the sealing portion 3, so that the heat dissipation can be improved. Moreover, the heat conducting path from the second vias 5 to the external terminals 6b is perpendicular to the principal surface of the substrate 1 and is thus the shortest path to the outside of the semiconductor device 100. Thus, efficient heat dissipation is possible also in the case of the resin sealed semiconductor device 100 in which the semiconductor chip 2 is not exposed.

The semiconductor chip 2 is protected by the sealing portion 3, and the heat conducting path for heat dissipation is in contact with neither the substrate 1 nor the semiconductor chip 2. Thus, the heat dissipation can be improved without deteriorating the reliability and the performance of the semiconductor device 100.

The second vias 5 do not penetrate the sealing portion 3 and are thus insulated from the substrate 1. Therefore, it is no longer necessary to provide electrodes to be connected to the vias on the surface of the substrate 1. Thus, without limiting the design of the semiconductor chip, the heat dissipation can be improved. Furthermore, the depth of each second via 5 can be adjusted so that the second via 5 reaches neither the semiconductor chip 2 nor the substrate 1. Thus, the second vias 5 can be arranged almost anywhere in the sealing portion 3. Thus, it is possible to obtain a heat dissipating structure having a very high degree of freedom depending on heat generation from the semiconductor chip 2.

Here, all the external terminals 6a arranged at an outer circumference section of the semiconductor chip 2 are not necessarily connected to the electrodes on the substrate 1 via the first vias 4. For example, a dummy external terminal which is not electrically continuous with the electrode on the substrate 1 may be included. The dummy external terminal may be connected to, for example, a via which does not penetrate the sealing portion 3.

The external terminals 6b arranged near the semiconductor chip 2 may include an external terminal connected to a via penetrating the sealing portion 3. In this case, on the upper surface of the substrate 1, an electrode connected to the via is provided near a mounting region of the semiconductor chip 2. Usually, interconnects drawn out from the semiconductor chip 2 are concentrated near the mounting region of the semiconductor chip 2, and thus a region for an electrode connected to a via and an interconnect connected to the electrode has to be ensured. This complicates the interconnection of the substrate 1. Moreover, a limitation on the arrangement of the vias, for example, excess of an underfill material or a dice bonding material used for mounting the semiconductor chip 2, is also found near the mounting region of the semiconductor chip 2. Therefore, arranging only through vias connected to the electrodes on the substrate 1 near the semiconductor chip 2 is not practical because of the limitations on interconnect design and via arrangement. That is, in order to obtain the effect of improving the heat dissipation, many of the vias connected to the external terminals 6a have to be the second vias 5 which do not penetrate the sealing portion 3.

(First Variation of First Embodiment)

Figure 2A:
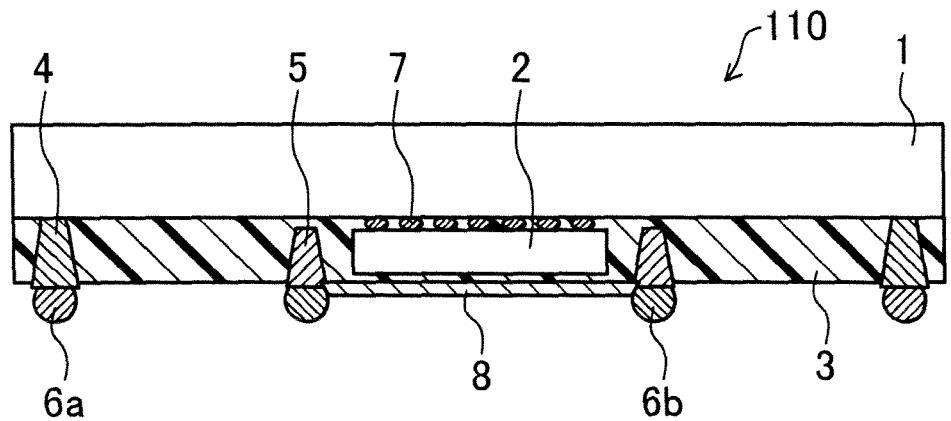
Figure 2B:
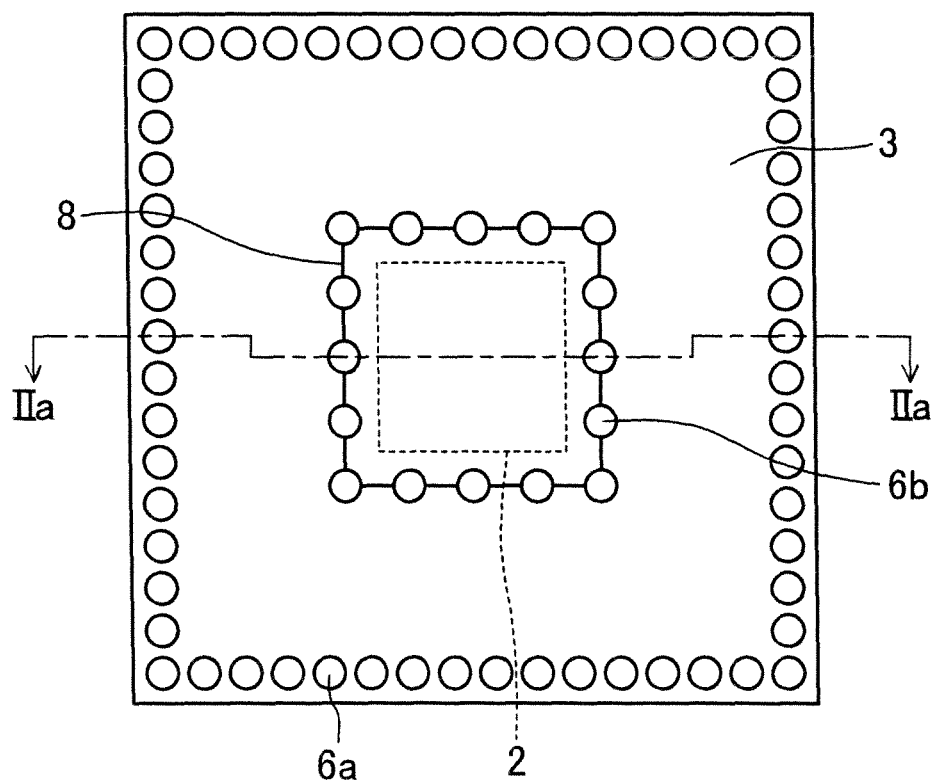

FIGS. 2A and 2B are respectively a cross-sectional view and a plan view schematically illustrating a semiconductor device according to a first variation.

In the first embodiment, the heat conducting path from the semiconductor chip 2 to the outside of the semiconductor device 100 is formed by the second vias 5 in the sealing portion 3 and the external terminals 6b each connected to a corresponding one of the second vias 5 and arranged on the surface of the sealing portion 3. As illustrated in FIG. 2A, a semiconductor device 110 of the present variation includes a heat dissipating body 8 on the surface of the sealing portion 3.

The heat dissipating body 8 is provided to cover a back surface of the semiconductor chip 2 (a surface opposite to a surface of the semiconductor chip 2 via which the semiconductor chip 2 is mounted to the substrate 1). The width of the heat dissipating body 8 is greater than the width of the semiconductor chip 2 when viewed in section. The heat dissipating body 8 is connected to the second vias 5 and the external terminals 6b. The heat dissipating body 8 is in contact with neither the substrate 1 nor the semiconductor chip 2 and is thus insulated from the substrate 1 and the semiconductor chip 2. A heat conducting path formed by the second vias 5 formed near the side surface of the semiconductor chip 2, the heat dissipating body 8 formed to face the back surface of the semiconductor chip 2, and the external terminals 6b dissipates heat generated from the semiconductor chip 2 to the outside of the semiconductor device 110.

The heat dissipating body 8 may be a metal film or a sheet having conductivity. In order to improve the heat dissipation, the heat dissipating body 8 may be a substance having high thermal conductivity.

On an upper surface of the semiconductor device 110 illustrated in FIG. 2B, the external terminals 6a, 6b and the heat dissipating body 8 are arranged on the sealing portion 3. The heat dissipating body 8 may be closely contacted with the surface of the sealing portion 3.

With this configuration, a heat conducting path for transferring heat generated from the semiconductor chip 2 from the sealing portion 3 via the heat dissipating body 8 on the surface of the sealing portion 3 to the second vias 5 and the external terminals 6b is formed in addition to the heat conducting path from the sealing portion 3 via the second vias 5 and the electrodes 6b to the outside of the semiconductor device 110, for example, to the mounting substrate, or the like. That is, a plurality of heat conducting paths in a side surface direction and in a back surface direction of the semiconductor chip 2 are provided to the semiconductor chip 2. Therefore, the heat dissipation can be further improved in addition to the effect of the first embodiment.

(Second Variation of First Embodiment)

Figure 3A:
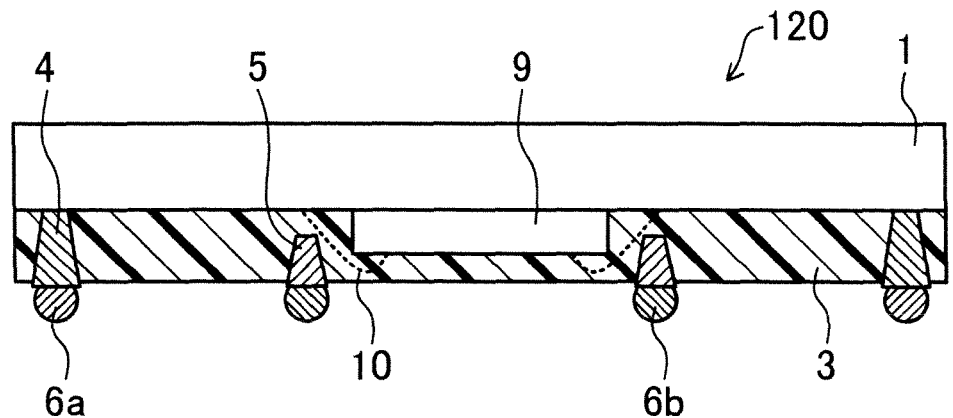
Figure 3B:
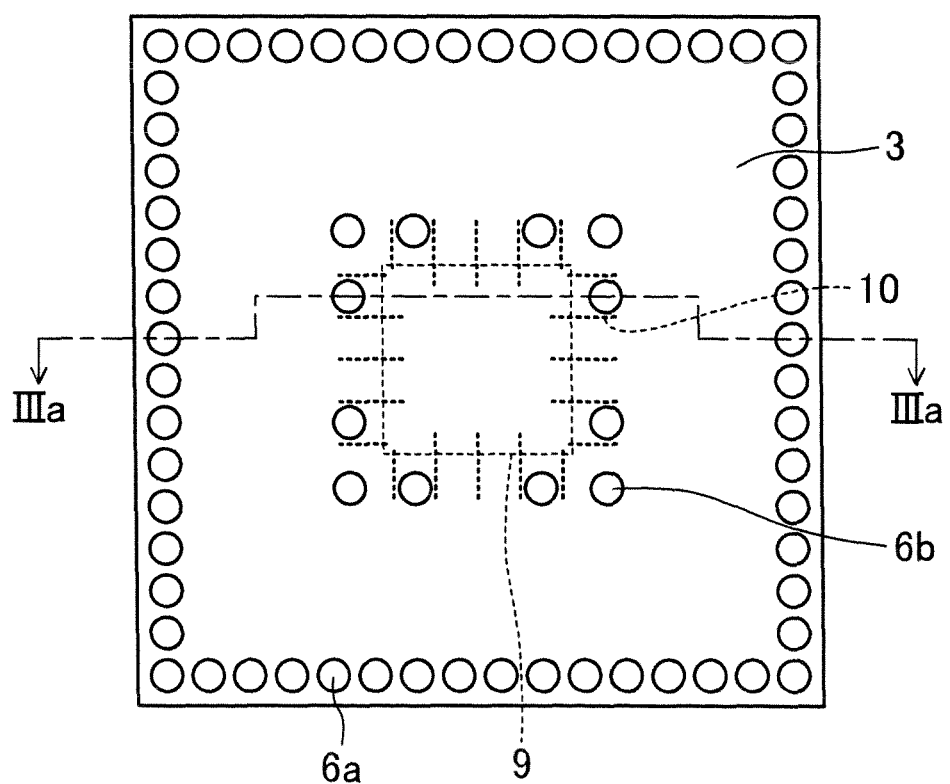

FIGS. 3A and 3B are respectively a cross-sectional view and a plan view schematically illustrating a semiconductor device according to a second variation.

In the first embodiment, the semiconductor chip 2 is flip chip connected to the upper surface of the substrate 1 via the bumps 7. As illustrated in FIG. 3A, a semiconductor device 120 of the present variation includes a semiconductor chip 9 electrically connected to the electrode on the substrate 1 via a plurality of wires 10. The wires 10 can be wires containing, for example, gold, copper, or the like as a main component.

On an upper surface of the semiconductor device 120 illustrated in FIG. 3B, the external terminals 6a, 6b are arranged on the sealing portion 3. The second vias 5 connected to the external terminals 6b do not penetrate the sealing portion 3, and the depth of the second vias 5 can be adjusted, so that each second via 5 can be disposed between the wires 10 in a region in which the wires 10 are arranged.

With this configuration, short heat conducting paths can also be provided for the wire bonding-type semiconductor device 120. Therefore, in a manner similar to the first embodiment, the heat dissipation can be improved.

(Third Variation of First Embodiment)

Figure 4A:
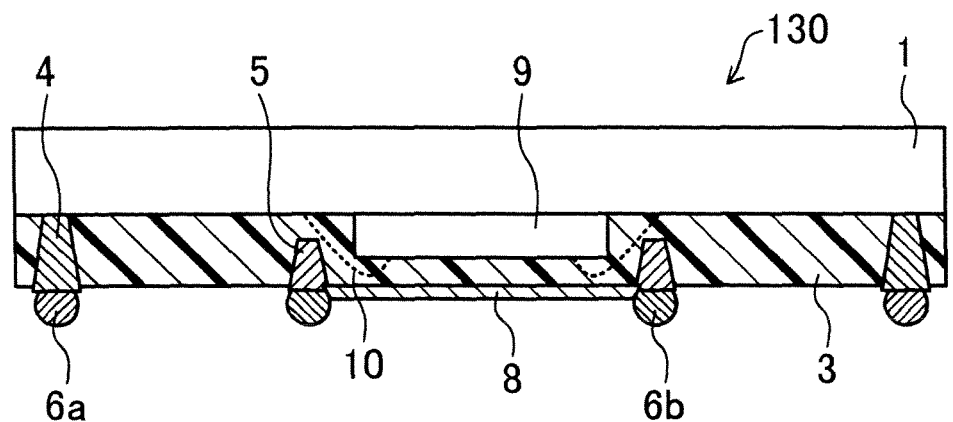
Figure 4B:
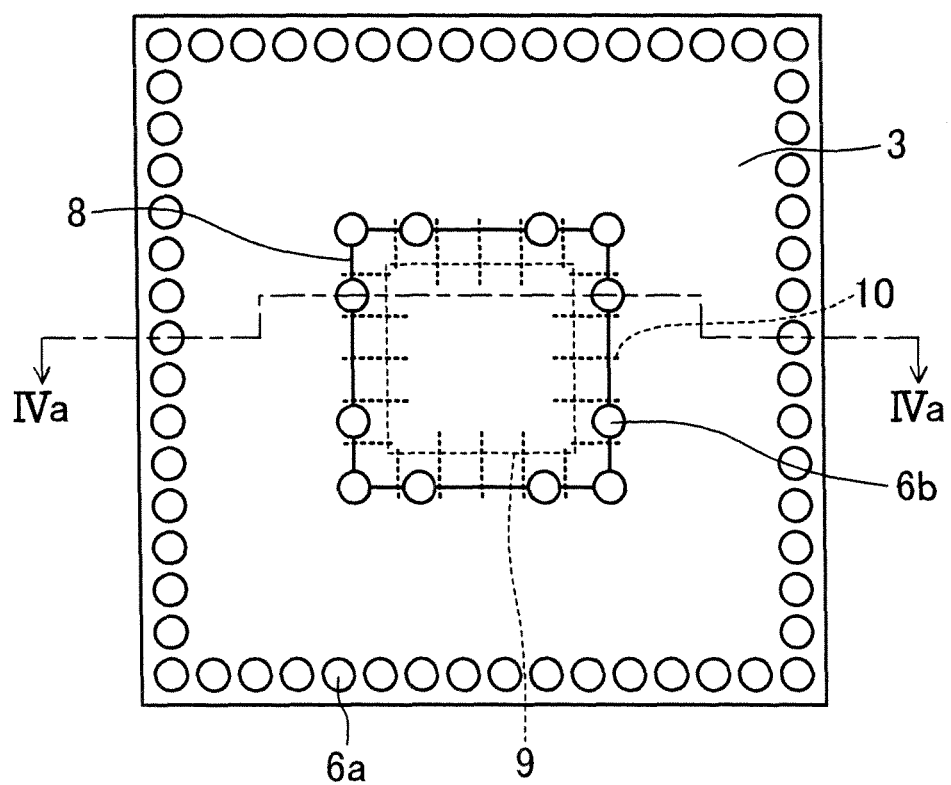

A semiconductor device 130 illustrated in FIG. 4A includes a semiconductor chip 9 electrically connected to a substrate 1 via wires 10 in a manner similar to the second variation and further includes a heat dissipating body 8 arranged on the surface of the sealing portion 3. Also in this case, as illustrated in FIG. 4B, each of the external terminals 6b can be disposed between the wires 10. With this configuration, a plurality of heat conducting paths in a side surface direction and in a back surface direction of the semiconductor chip 9 can be provided to the semiconductor chip 9. Therefore, also in the wire bonding-type semiconductor device 130, the heat dissipation can be improved.

Second Embodiment

Figure 5:
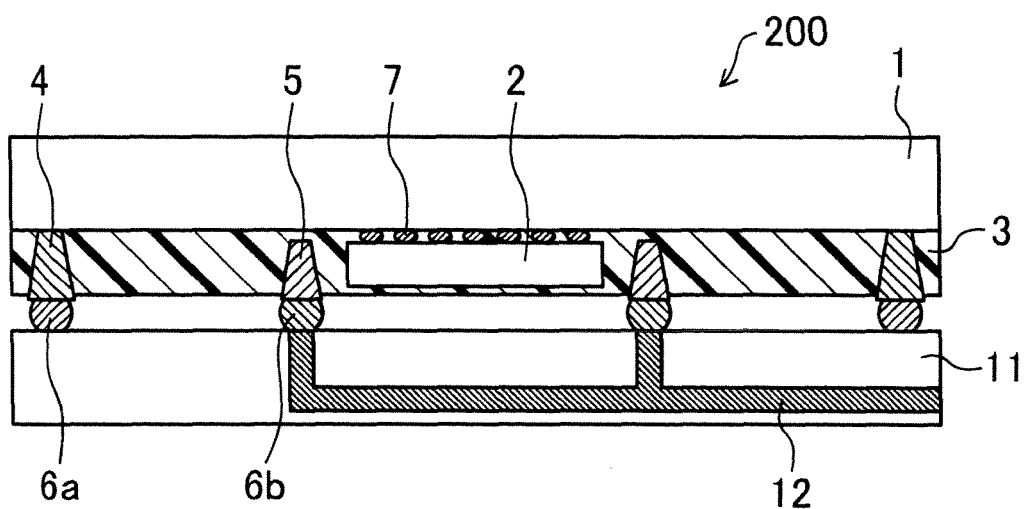
FIG. 5 is a cross-sectional view illustrating a semiconductor device assembly according to a second embodiment.

FIG. 5 is a cross-sectional view schematically illustrating an assembly of a semiconductor device according to a second embodiment.

In the first embodiment, the semiconductor device 100 is mounted to the mounting substrate via the external terminals 6a, 6b. As illustrated in FIG. 5, an assembly 200 of the present embodiment includes a constant electric potential supply 12 provided in a mounting substrate 11.

The constant electric potential supply 12 in the mounting substrate 11 may have a form of an interconnect or a form of a plane. The constant electric potential supply 12 may be a metal film or an interconnect made of copper or aluminum. The electric potential of the constant electric potential supply 12 in the mounting substrate 11 is a power supply voltage or a ground voltage and is fixed at a predetermined electric potential (constant electric potential).

The constant electric potential supply 12 formed in the mounting substrate 11 is bonded to external terminals 6b formed on a sealing portion 3 by solder, or the like, thereby fixing second vias 5 formed in the sealing portion 3 and the external terminals 6b at the constant electric potential.

Rendering the second vias 5 and the external terminals 6b electrically continuous with the constant electric potential supply 12 allows the second vias 5 and the external terminals 6b to serve as an electric shield as well as the heat conducting path.

The second vias 5 are arranged along all sides of the semiconductor chip 2, so that the effect of the shield can be increased.

This configuration provides the effect of the first embodiment and can also reduce release of electric noise generated from the semiconductor chip 2 to lateral sides of the semiconductor device 200. Additionally, this configuration reduces noise from the mounting substrate 11 and the outside of the semiconductor device 200, so that the semiconductor chip 2 can be stably operated.

Similar to the variations of the first embodiment, a heat dissipating body 8 (not shown) may be further provided to cover a back surface of the semiconductor chip 2. With this configuration, the heat dissipating body 8 is electrically continuous with the second vias 5 and the external terminals 6b. Thus, the heat dissipating body 8 is also fixed at the constant electric potential. That is, rendering the second vias 5, the external terminals 6b, and the heat dissipating body 8 electrically continuous with the constant electric potential supply 12 in the mounting substrate 11 allows the second vias 5, the external terminals 6b, and the heat dissipating body 8 to serve as an electric shield covering a side surface and the back surface of the semiconductor chip 2 as well as the heat conducting path. Thus, the effect of the shield can be further increased.

(Variation of Second Embodiment)

Figure 6:
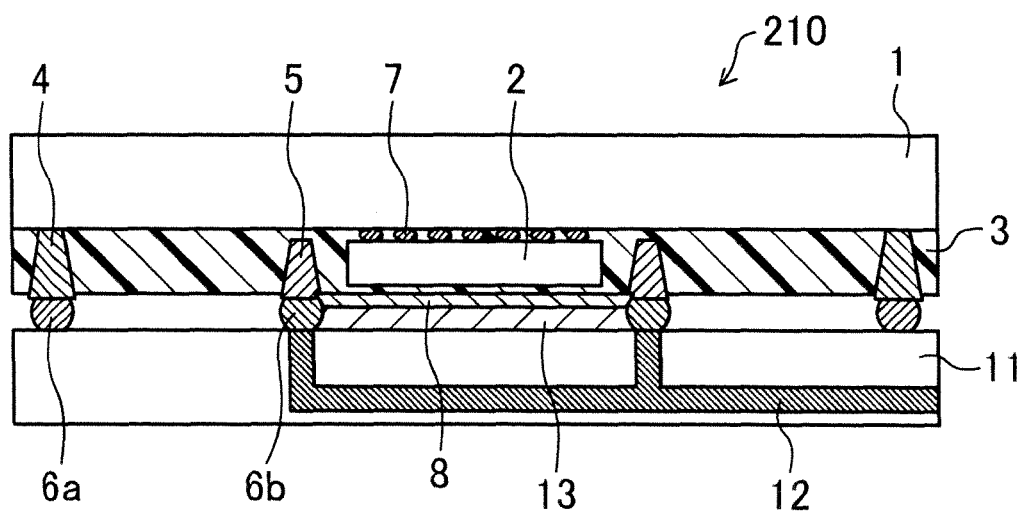
FIG. 6 is a cross-sectional view illustrating a semiconductor device assembly according to a variation of the second embodiment.

FIG. 6 is a cross-sectional view schematically illustrating an assembly of a semiconductor device according to a variation.

In the second embodiment, the electric shield formed by the second vias 5 and the external terminals 6b and the electric shield further including the heat dissipating body 8 in addition to the second vias 5 and the external terminals 6b are described. As illustrated in FIG. 6, an assembly 210 of the present variation includes a conductor 13 provided between the mounting substrate 11 and the heat dissipating body 8. The conductor 13 may be a paste made of a conductive substance or a metal plate, or may be a metal thin film or a metal sheet.

With this configuration in which the conductor 13 is provided, the thickness of the electric shield formed by the second vias 5, the external terminals 6b, and the heat dissipating body 8 is increased. Thus, release of electric noise generated from a semiconductor chip 2 to the outside of the semiconductor device can be more effectively reduced. With this configuration, noise from the outside of the mounting substrate 11 and the semiconductor device is reduced, so that the semiconductor chip 2 can be stably operated.

Moreover, the conductor 13 is provided, so that the area at which the external terminals 6b and the heat dissipating body 8 are in contact with the mounting substrate 11 is increased. Thus, the volume of the heat conducting path from the semiconductor device to the mounting substrate 11 is increased, which further improves the heat dissipation.

Third Embodiment

Figure 7A:
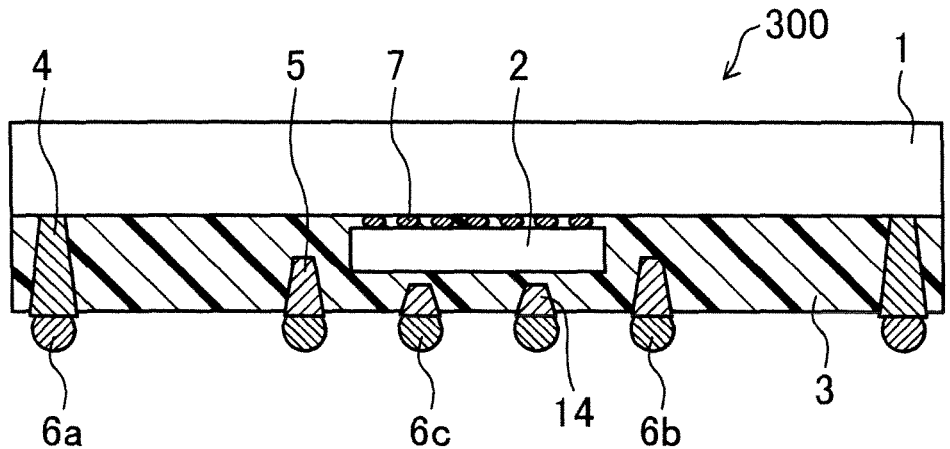
Figure 7B:
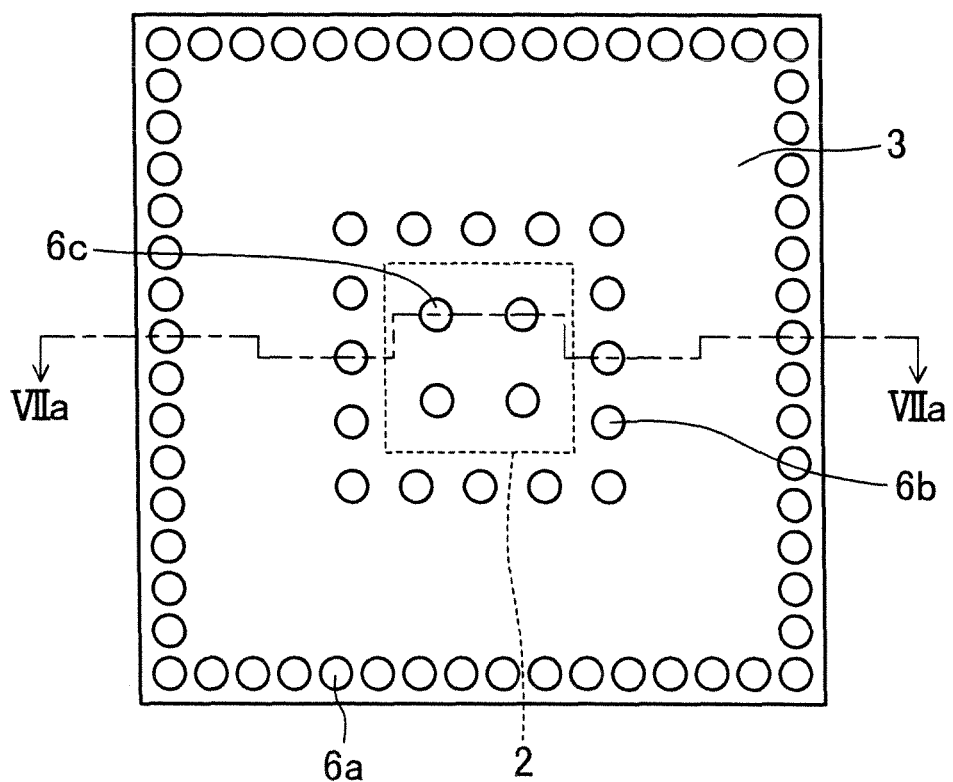

FIGS. 7A and 7B are respectively a cross-sectional view and a plan view schematically illustrating a configuration of a semiconductor device according to a third embodiment.

The first embodiment includes the second vias 5 provided at positions located outwardly from the semiconductor chip 2, in particular, near the semiconductor chip 2 and the external terminals 6b connected to the second vias 5 as a heat conducting path through which heat generated from the semiconductor chip 2 is dissipated. As illustrated in FIG. 7A, a semiconductor device 300 of the present embodiment includes a plurality of recessed portions formed in a region facing a back surface of a semiconductor chip 2 in a sealing portion 3. The recessed portions extend in a thickness direction of the sealing portion 3 to such a depth that the recessed portions do not reach the back surface of the semiconductor chip 2. The recessed portions are filled with a conductive substance, thereby forming a plurality of third vias 14. The third vias are in contact with neither the semiconductor chip 2 nor a substrate 1 and are thus insulated from the semiconductor chip 2 and the substrate 1. On a surface of the sealing portion 3, external terminals 6c connected to the third vias 14 are provided.

Heat generated from the semiconductor chip 2 is transferred to a mounting substrate (not shown) mainly via the second vias 5 and the external terminals 6b and via the third vias 14 and the external terminals 6c, so that the heat is dissipated to the outside of the semiconductor device 300.

On an upper surface of the semiconductor device 300 illustrated in FIG. 7B, external terminals 6a, 6b and the external terminals 6c are arranged on the sealing portion 3.

The external terminals 6b are arranged at positions located outwardly from the semiconductor chip 2 or near the semiconductor chip 2 to surround the semiconductor chip 2. The external terminals 6a are arranged outside the external terminals 6b. The external terminals 6a may be arranged in an outer edge region of the semiconductor device 300. Each of the external terminals 6a is connected to a corresponding one of the first vias 4 in the sealing portion 3, and each of the external terminals 6b is connected to a corresponding one of the second vias 5 in the sealing portion 3.

The external terminals 6c are arranged in a region located inwardly from the external terminals 6b and overlapping the semiconductor chip 2 when viewed in plan. Each of the external terminals 6c is connected to a corresponding one of the third vias 14 in the sealing portion 3.

With this configuration, the second vias 5 are arranged in the periphery of the semiconductor chip 2 which is a heat source, in particular, near a side surface of the semiconductor chip 2. The third vias 14 are further arranged near the back surface of the semiconductor chip 2. That is, in the sealing portion 3, heat from the heat source (semiconductor chip 2) is efficiently transferred from the side surface and the back surface of the semiconductor chip 2 to thermal conductors (the vias), so that the heat dissipation can be improved. The heat conducting path from the second vias 5 to the external terminals 6b and the heat conducting path from the third vias 14 to the external terminals 6c are both perpendicular to a principal surface of the substrate 1 and are thus the shortest paths to the outside of the semiconductor device 300. Therefore, efficient heat dissipation is possible even in the case of a resin sealed semiconductor device in which the semiconductor chip 2 is not exposed.

(Variation of Third Embodiment)

Figure 8A:
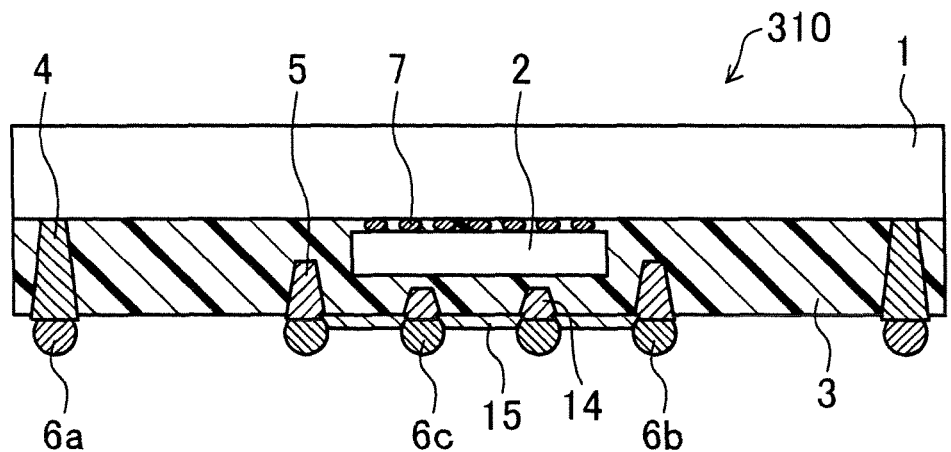
FIGS. 8A and 8B show a configuration of a semiconductor device according to a variation of the third embodiment, wherein the FIG. 8A is a cross-sectional view taken along the line VIIIa-VIIIa of FIG. 8B.
Figure 8B:
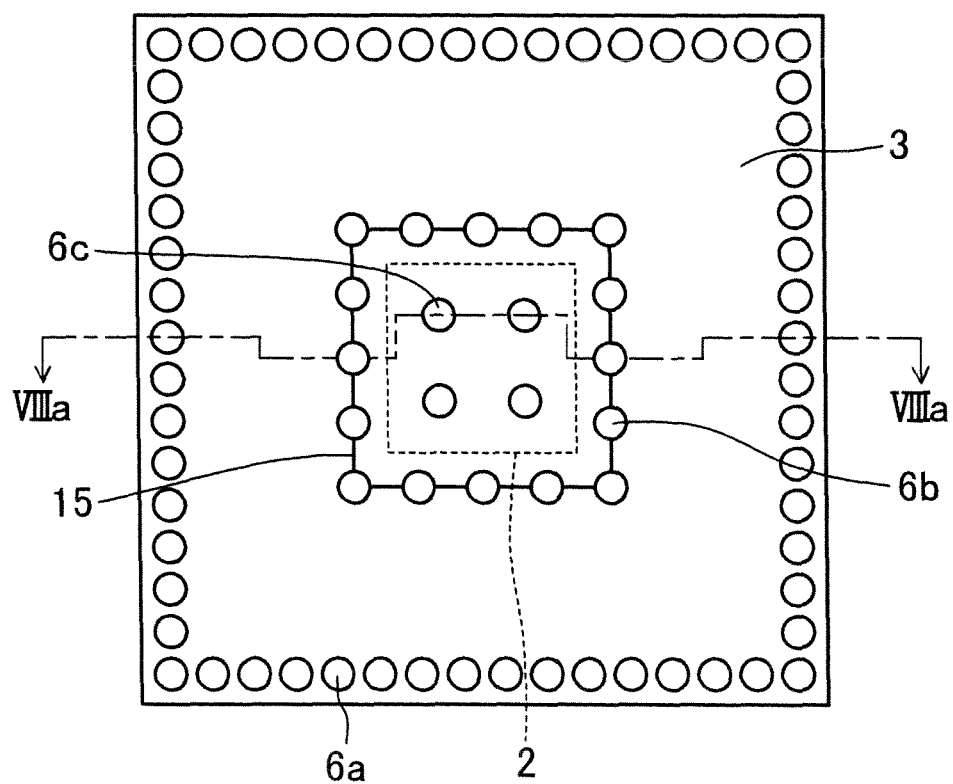

FIGS. 8A and 8B are respectively a cross-sectional view and a plan view schematically illustrating a semiconductor device according to a variation.

In the third embodiment, the heat conducting paths from the semiconductor chip 2 to the outside of the semiconductor device 300 are formed by the second vias 5 and the third vias 14 in the sealing portion 3, and the external terminals 6b, 6c connected to the second vias 5 and the third vias 14, respectively and arranged on the surface of the sealing portion 3. As illustrated in FIG. 8A, a semiconductor device 310 of the present variation further includes a heat dissipating body 15 provided on the surface of the sealing portion 3. The heat dissipating body 15 has a larger plane area than a semiconductor chip 2 and is connected to the second vias 5, the third vias 14, and the external terminals 6b, 6c.

The heat dissipating body 15 is provided to cover the back surface of the semiconductor chip 2 and has a larger width than the semiconductor chip 2 when viewed in cross section. The heat dissipating body 15 is connected to the second vias 5, the third vias 14, and the external terminals 6b, 6c. The heat dissipating body 15 is in contact with neither a substrate 1 nor the semiconductor chip 2 and is thus isolated from the substrate 1 and the semiconductor chip 2. These heat conducting paths formed by the second vias 5 formed near the side surface of the semiconductor chip 2, the third vias 14 formed near the back surface of the semiconductor chip 2, the heat dissipating body 15, and the external terminals 6b, 6c dissipate heat generated from the semiconductor chip 2 to the outside of the semiconductor device 310.

The heat dissipating body 15 may be a metal film or a sheet having conductivity. In order to improve the heat dissipation, the heat dissipation body 15 may be a substance having high thermal conductivity.

On the upper surface of the semiconductor device 310 illustrated in FIG. 8B, the external terminals 6a, 6b, 6c, and the heat dissipating body 15 are arranged on the sealing portion 3. The heat dissipating body 15 may be in close contact with the surface of the sealing portion 3.

With this configuration, a heat conducting path through which heat generated from the semiconductor chip 2 is transferred from the sealing portion 3 to the second vias 5, the third vias 14, and the external terminals 6b, 6c via the heat dissipating body 15 on the surface of the sealing portion 3 is formed in addition to the heat conducting paths for dissipating the heat from the sealing portion 3 to the mounting substrate (not shown), or the like outside the semiconductor device 310 via the second vias 5 and the external terminals 6b, and via the third vias 14 and the external terminals 6c. Thus, the heat dissipation can be further improved.

Fourth Embodiment

Figure 9:
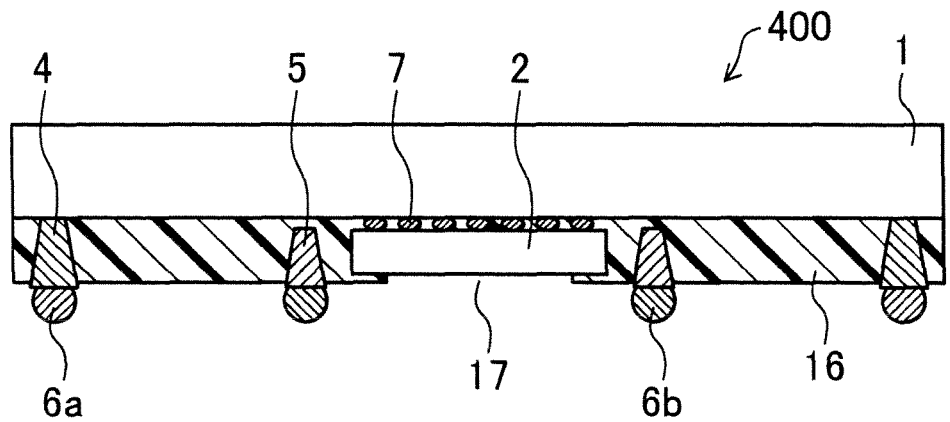
FIG. 9 is a cross-sectional view illustrating a configuration of a semiconductor device according to a fourth embodiment.

FIG. 9 is a cross-sectional view schematically illustrating a configuration of a semiconductor device according to a fourth embodiment.

In the semiconductor device 100 of the first embodiment, the back surface of the semiconductor chip 2 is covered with the sealing portion 3 whose surface is flat. As illustrated in FIG. 9, a semiconductor device 400 of the present embodiment includes a sealing portion 16 in which an opening 17 is formed and a semiconductor chip 2 whose back surface is partially exposed through the opening 17.

The opening 17 may have any shape such as a square, rectangular, or round shape as long as the area of the opening 17 is smaller than that of the back surface of the semiconductor chip 2, and the opening 17 does not extends beyond edges of the semiconductor chip 2. From the point of view of improving the heat dissipation, the opening preferably has a largest possible aperture with a center positioned in a portion at which the amount of heat generation from the chip is large.

The opening 17 can be formed by chemically or physically polishing a surface of the sealing portion 16 to expose the back surface of the semiconductor chip 2. The chemical or physical polishing can be any method such as polishing by using micro particles or a grinder (grindstone), etching, laser processing, or the like.

With this configuration, heat generated from the semiconductor chip 2 is dissipated to a mounting substrate, or the like outside the semiconductor device 400 via the heat conducting path formed by the sealing portion 16, second vias 5, and external terminals 6b. The back surface of the semiconductor chip 2 is exposed from the sealing portion 16, so that a heat transfer path through which heat generated from the semiconductor chip 2 is directly dissipated to the air outside the semiconductor device 400 is formed. This heat transfer path can further improve the heat dissipation together with the heat transfer path formed by the second vias 5 and the external terminals 6b.

(Variation of Fourth Embodiment)

Figure 10:
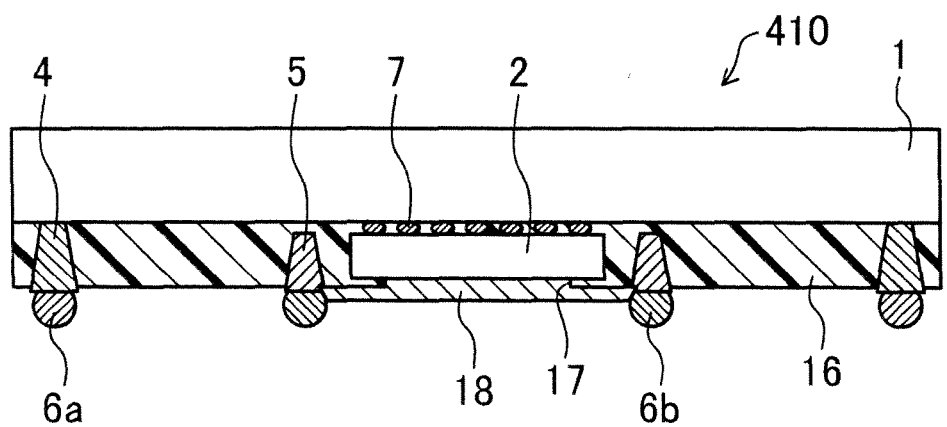
FIG. 10 is a cross-sectional view illustrating a configuration of a semiconductor device according to a variation of the fourth embodiment.

FIG. 10 is a cross-sectional view schematically illustrating a configuration of a semiconductor device of a variation.

In the fourth embodiment, the back surface of the semiconductor chip 2 of the semiconductor device 400 is partially exposed through the opening 17 formed in the sealing portion 3. As illustrated in FIG. 10, a semiconductor device 410 of the present variation includes a heat dissipating body 18 provided to cover the opening 17 in the sealing portion 16 foil led at the back surface of the semiconductor chip 2.

The heat dissipating body 18 is provided to be in contact with the back surface of the semiconductor chip 2 and the surface of the sealing portion 16. The heat dissipating body 18 is larger than the back surface of the semiconductor chip 2 and is connected to the second vias 5 and the external terminals 6b.

The heat dissipating body 18 may be a metal film or a sheet having conductivity. In order to improve the heat dissipation, the heat dissipating body 18 may be a substance having high thermal conductivity.

With this configuration, heat generated from the semiconductor chip 2 is dissipated to the outside of the semiconductor device 410, for example, to a mounting substrate, or the like through the heat conducting path formed by the sealing portion 16, the second vias 5, and the external terminals 6b. Further, the heat dissipating body 18 is provided on the back surface of the semiconductor chip 2 which is exposed through the opening 17 in the sealing portion 16 and on the surface of the sealing portion 16, so that a heat conducting path for dissipating heat via the heat dissipating body 18 to the second vias 5 and the external terminals 6b is formed. Thus, a plurality of heat conducting paths through which heat released from a side surface and the back surface of the semiconductor chip 2 can be efficiently dissipated are formed. Thus, the heat dissipation of the semiconductor device 410 can be further improved.

Fifth Embodiment

Figure 11:
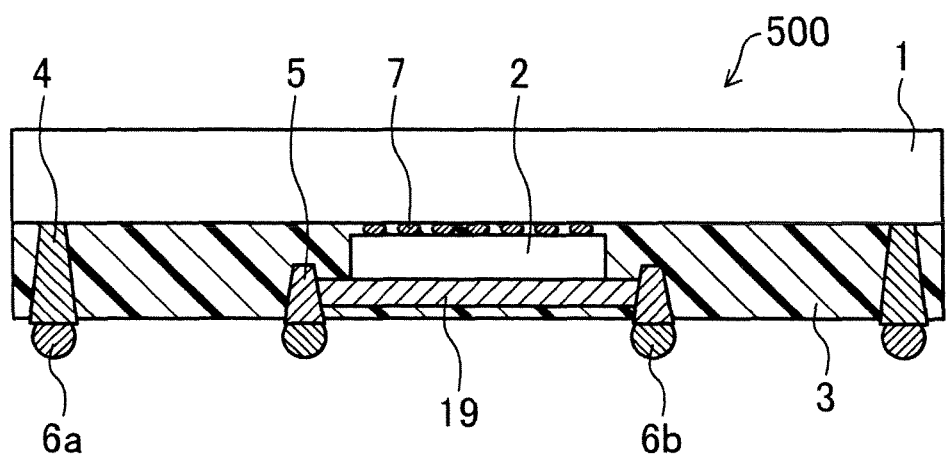
FIG. 11 is a cross-sectional view illustrating a configuration of a semiconductor device according to the fifth embodiment.

FIG. 11 is a cross-sectional view schematically illustrating a configuration of a semiconductor device according to a fifth embodiment.

In the first variation of the first embodiment, the heat dissipating body 8 is provided on the surface of the sealing portion 3 of the semiconductor device 110. As illustrated in FIG. 11, a semiconductor device 500 of the present embodiment includes a heat dissipating body 19 formed in a sealing portion 3.

The heat dissipating body 19 is provided to be in contact with a back surface of a semiconductor chip 2 and has a greater width than the semiconductor chip 2 when viewed in cross section. The heat dissipating body 19 is connected to a plurality of second vias 5. The heat dissipating body 19 is not in contact with a substrate 1 and is thus insulated from the substrate 1. The heat dissipating body 19 is in contact with the back surface of the semiconductor chip 2 but is not electrically connected to circuits of the semiconductor chip 2.

The heat dissipating body 19 may be a metal film or a sheet having conductivity. In order to improve the heat dissipation, the heat dissipating body 19 may be a substance having high thermal conductivity.

With this configuration, heat generated from the semiconductor chip 2 is dissipated through a heat conducting path formed by the sealing portion 3, the second vias 5, and external terminals 6b to the outside of the semiconductor device 500, for example, to a mounting substrate, or the like. This configuration further includes a heat conducting path from the heat dissipating body 19 which is in contact with the back surface of the semiconductor chip 2 to the second vias 5 connected to the heat dissipating body 19 and the external terminals 6b. Thus, the heat dissipation of the semiconductor device 500 can be further improved. In particular, according to the present variation, heat released from the back surface of the semiconductor chip 2 can be directly transferred to the heat dissipating body 19 without being transferred through the sealing portion 3. Thus, more efficient heat dissipation is possible compared to the configuration in which only the heat conducting path including the sealing portion 3 is formed.

Sixth Embodiment

Figure 12A:
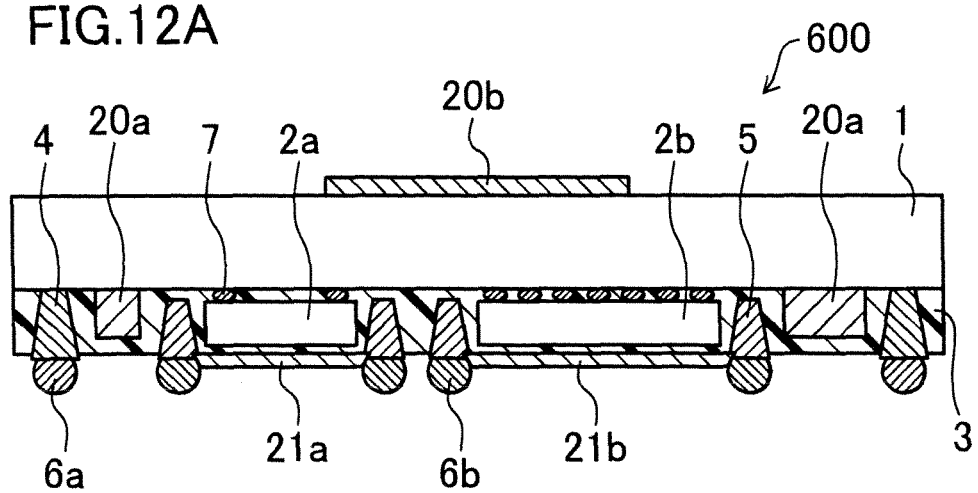
Figure 12B:
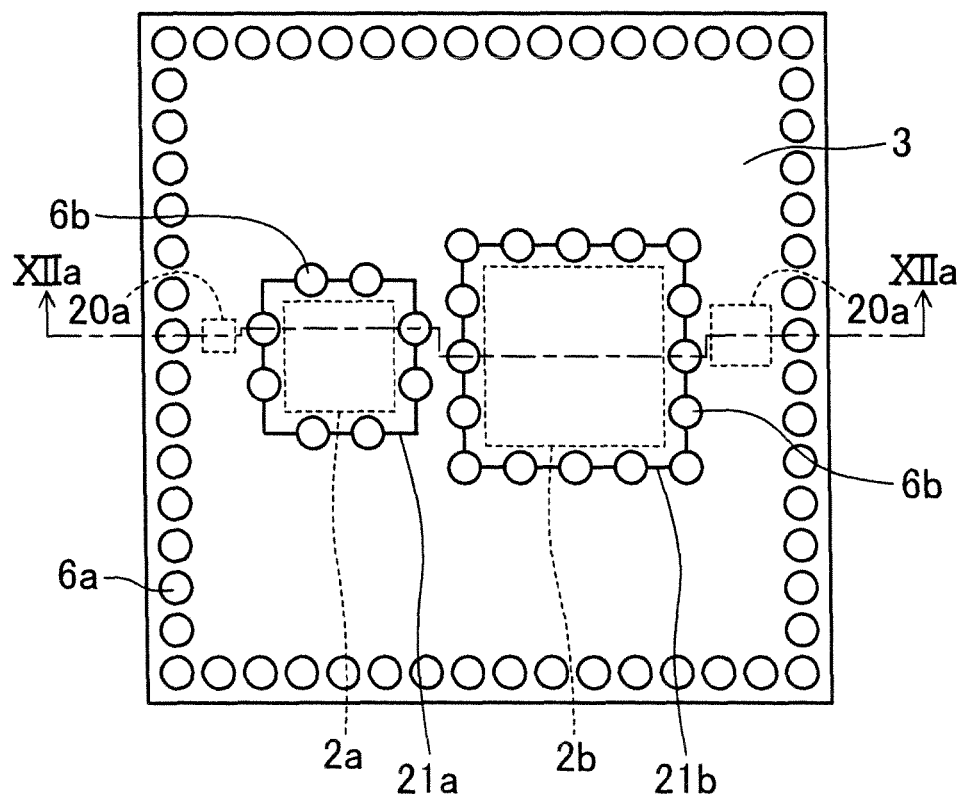

FIGS. 12A and 12B are respectively a cross-sectional view and a plan view schematically illustrating a configuration of a semiconductor device according to a sixth embodiment.

In the first to fifth embodiments and the variations thereof, one or more heat conducting paths for heat released from one semiconductor chip 2 mounted to the upper surface of the substrate 1 of the semiconductor device to the outside of the semiconductor device are formed. As illustrated in FIG. 12A, a semiconductor device 600 of the present embodiment includes heat conducting paths to the outside of the semiconductor device 600. The heat conducting paths are each provided to a corresponding one of a plurality of semiconductor chips 2a, 2b mounted to an upper surface of a substrate 1.

Depending on functions required for the semiconductor device 600, electronic components 20a, 20b in addition to the semiconductor chips may be mounted. In the present embodiment, the electronic components 20a are provided on the upper surface of the substrate 1, and the electronic component 20b is provided on a back surface of the substrate 1 (a surface opposite to the surface of the substrate 1 on which the semiconductor chips 2a, 2b are mounted).

On the upper surface of the substrate 1, a wiring pattern is formed, and the wiring pattern includes an electrode (not shown) electrically connected to the semiconductor chips and first vias 4. A pattern electrically connected to the electronic component 20b is also formed on the back surface of the substrate 1.

The semiconductor chips 2a, 2b are flip-chip mounted to the upper surface of the substrate 1 via bumps 7. Principal surfaces of the semiconductor chips 2a, 2b, that is, surfaces on which the bumps 7 are bonded, include active regions in which integrated circuits including transistors and capacitors are formed.

A sealing portion 3 covers the semiconductor chips 2a, 2b and is formed on the upper surface of the substrate 1. The sealing portion 3 is, for example, an insulator such as a resin.

Through holes extending in a thickness direction of the sealing portion 3 from the electrode on the upper surface of the substrate 1 to an upper surface of the sealing portion 3 are formed in the sealing portion 3. The through holes are filled with a conductive substance, thereby forming the first vias 4. On a surface of the sealing portion 3 opposite to the substrate 1, external terminals 6a are arranged to be connected to the first vias 4. That is, one end of each first via 4 is connected to the electrode on the upper surface of the substrate 1, and the other end is connected to a corresponding one of the external terminals 6a exposed from the sealing portion 3. Through this electric pathway, the function of the semiconductor chips 2a, 2b is utilized from outside of the semiconductor device 600.

Moreover, recessed portions are formed in the sealing portion 3 at positions located outwardly from each of the semiconductor chips 2a, 2b, in particular, near a side surface of each of the semiconductor chips 2a, 2b. The recessed portions extend in a thickness direction of the sealing portion 3 to such a depth that the recessed portions do not reach the wiring pattern of the substrate 1. The recessed portions extending to such a depth that the recessed portions do not reach the wiring pattern of the substrate 1 are filled with a conductive substance, thereby forming second vias 5. The second vias 5 are in contact with none of the semiconductor chips 2a, 2b and the substrate 1 and are thus insulated from the semiconductor chips 2a, 2b and the substrate 1. On the surface of the sealing portion 3, external terminals 6b are arranged to be connected to the second vias 5. A heat conducting path formed by the second vias 5 formed near the side surfaces of the semiconductor chips 2a, 2b and the external terminals 6b dissipates heat generated from the semiconductor chips 2a, 2b to the outside of the semiconductor device 600.

A plurality of heat dissipating bodies 21a, 21b are further formed on the surface of the sealing portion 3 to cover back surfaces of the semiconductor chip 2a, 2b, respectively. The heat dissipating body 21a has a greater width than the semiconductor chip 2a when viewed in cross section, and the heat dissipating body 21b has a greater width than the semiconductor chip 2b when viewed in cross section. The heat dissipating body 21a is connected to the second vias 5 formed near the semiconductor chip 2a and the external terminals 6b. The heat dissipating body 21a is in contact with neither the substrate 1 nor the semiconductor chip 2a and is thus insulated from the substrate 1 and the semiconductor chip 2a. The heat dissipating body 21b is connected to the second vias 5 formed near the semiconductor chip 2b and the external terminals 6b. The heat dissipating body 21b is in contact with neither the substrate 1 nor the semiconductor chip 2b and is thus insulated from the substrate 1 and the semiconductor chip 2b.

Heat conducting paths formed by the heat dissipating bodies 21a, 21b respectively formed on the back surfaces of the semiconductor chips 2a, 2b and the second vias 5 and the external terminals 6b connected to the heat dissipating bodies 21a, 21b dissipate heat generated from the semiconductor chips 2a, 2b to the outside of the semiconductor device 600.

The heat dissipating bodies 21a, 21b may be metal films or sheets having conductivity. In order to improve the heat dissipation, the heat dissipating bodies 21a, 21b may be substances having high thermal conductivity.

The electronic components 20a mounted to the upper surface of the substrate 1 are elements such as capacitors, resistors, inductors, or filters, and the electronic component 20b mounted to the back surface of the substrate 1 is an antenna element.

On an upper surface of the semiconductor device 600 illustrated in FIG. 12B, the external terminals 6a, 6b and the heat dissipating bodies 21a, 21b are arranged on the surface of the sealing portion 3. The external terminals 6b are arranged at positions located outwardly from each of the semiconductor chips 2a, 2b, preferably near each of the semiconductor chips 2a, 2b to surround each of the semiconductor chips 2a, 2b. The external terminals 6a are arranged outside the external terminals 6b. The external terminals 6a may be arranged in an outer edge region of the semiconductor device 600. Each of the external terminals 6a is connected to a corresponding one of the first vias 4 in the sealing portion 3.

The heat dissipating body 21a is connected to the external terminals 6b formed near the semiconductor chip 2a, and the heat dissipating body 21b is connected to the external terminal 6b formed near the semiconductor chip 2b. The heat dissipating body 21a is larger than the back surface of the semiconductor chip 2a and is connected to the second vias 5 and the external terminals 6b. The heat dissipating body 21b is larger than the back surface of the semiconductor chip 2b and is connected to the second vias 5 and the external terminals 6b.

With this configuration, heat generated from the semiconductor chips 2a, 2b is transferred to the second vias 5 formed near the semiconductor chips 2a, 2b via the sealing portion 3 and is dissipated to the outside of the semiconductor device 600, for example, to a mounting substrate, or the like through the heat conducting path formed by the second vias 5 and the external terminals 6b. Heat is transferred from the back surfaces of the semiconductor chips 2a, 2b respectively to the heat dissipating bodies 21a, 21b via the sealing portion 3 and is dissipated through the heat conducting path formed by the second vias 5 and the external terminals 6b connected to the heat dissipating bodies 21a, 21b. Thus, even in the case of the semiconductor device 600 to which the semiconductor chips 2a, 2b are mounted, an efficient heat dissipating structure is provided to each of the semiconductor chips, so that efficient heat dissipation is possible.

The semiconductor device 600 is mounted to a mounting substrate (not shown) via the external terminals 6a, 6b to obtain an assembly. Heat generated from the semiconductor chips 2a, 2b of the assembly is transferred to the mounting substrate mainly via the heat dissipating bodies 21a, 21b, the second vias 5, and the external terminals 6b and is dissipated to the outside of the semiconductor device 600.

Here, rendering the second vias 5, the external terminals 6b, and the heat dissipating bodies 21a, 21b electrically continuous with a constant electric potential supply of the mounting substrate allows the structure including the second vias 5, the external terminals 6b, and the heat dissipating bodies 21a, 21b to serve as an electric shield as well as the heat conducting path. The second vias 5 are arranged to surround all of four sides of each of the semiconductor chips 2a, 2b, and the heat dissipating bodies 21a, 21b are arranged to cover the entire back surface of the semiconductor chips 2a, 2b, respectively. Thus, the shield effect can be further increased.

With this configuration, propagation of electric noise generated from the semiconductor chip 2a (2b) to the electronic components 20a, 20b adjacent to the semiconductor chip 2a (2b) and to the other semiconductor chip 2b (2a) can be reduced. Moreover, release of the electric noise generated from the semiconductor chip 2a (2b) to the outside of the semiconductor device 600 can be reduced.

This configuration further reduces noise from the mounting substrate and the outside of the semiconductor device 600 or from the electronic components 20a, 20b adjacent to the semiconductor chip 2a (2b) and the other semiconductor chip 2b (2a), so that the semiconductor device 600 can be stably operated.

The second vias 5 are not in contact with the substrate 1. Thus, the positions and the number of the second vias 5 to be arranged can be optimally determined according to the size of the semiconductor chip and the amount of heat generation from the semiconductor chip. Therefore, even when a plurality of semiconductor chips are mounted, a heat dissipation effect corresponding to the amount of heat generation from each of the semiconductor chips can be obtained, so that the heat dissipation can be improved.

(Variation of Sixth Embodiment)

Figure 13A:
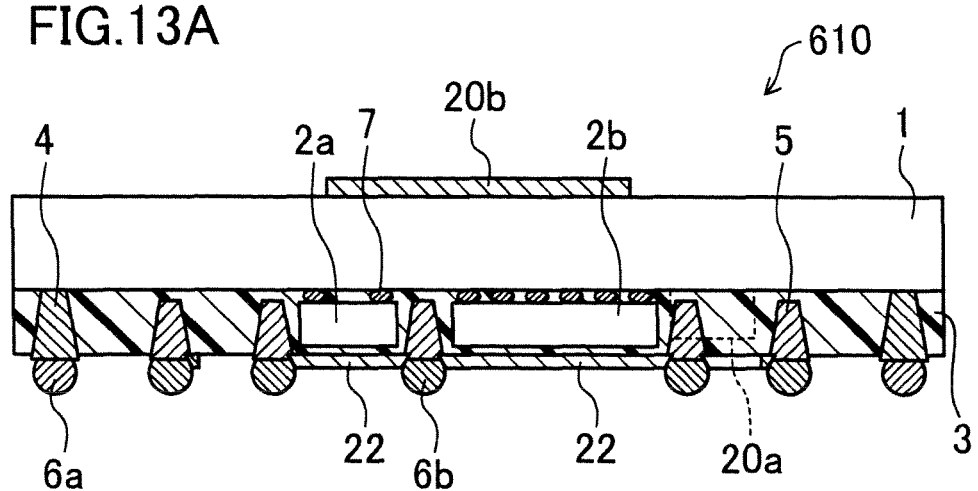
Figure 13B:
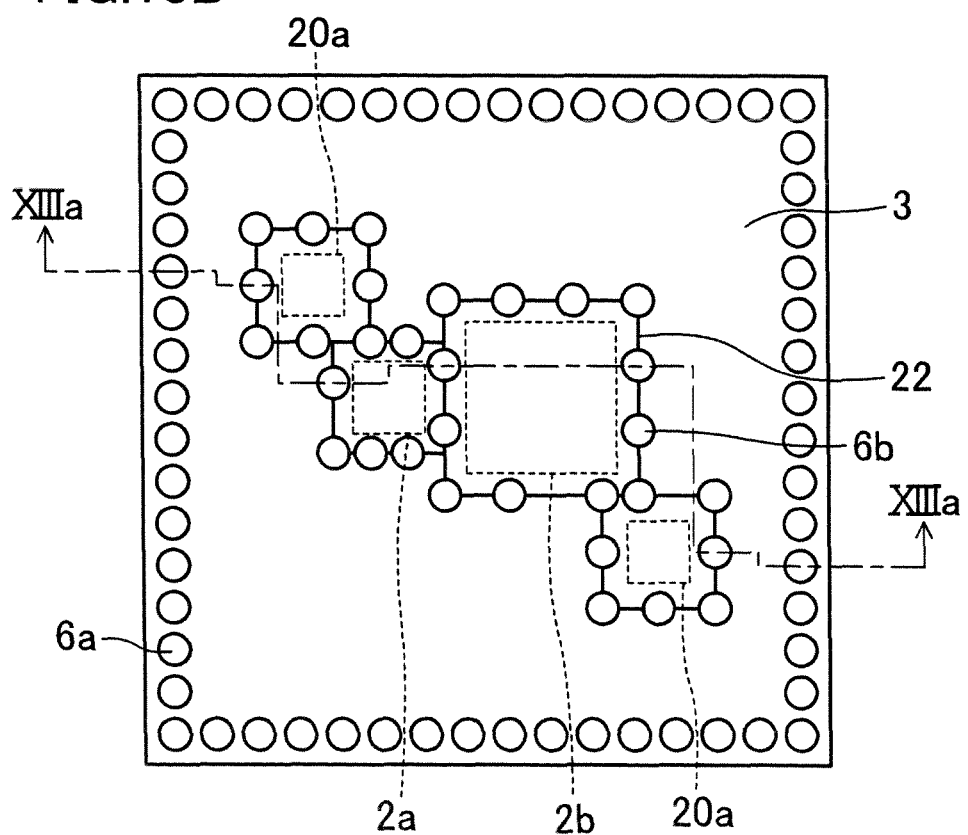

The FIGS. 13A and 13B are respectively a cross-sectional view and a plan view illustrating a configuration of a semiconductor device according to a variation.

In the sixth embodiment, in the semiconductor device 600, the heat conducting paths are independently provided to each of the semiconductor chips 2a, 2b mounted to the upper surface of the substrate 1. Specifically, the second vias 5 arranged near the semiconductor chip 2a, the heat dissipating body 21a, and the external terminals 6b connected to the second vias 5 and the heat dissipating body 21a form the heat conducting path and serve as the electric shield for the semiconductor chip 2a. The second vias 5 arranged near the semiconductor chip 2b, the heat dissipating body 21b, and the external terminals 6b connected to the second vias 5 and the heat dissipating body 21b form the heat conducting path and serves as the electric shield for the semiconductor chip 2b.

As illustrated in FIG. 13A, a semiconductor device 610 of the present variation includes heat dissipating bodies 22 provided on the surface of the sealing portion 3 and connected to each other, and the heat dissipating bodies 22 are arranged to face the back surfaces of the semiconductor chips 2a, 2b and the electronic components 20a.

On an upper surface of the semiconductor device 610 illustrated in FIG. 13B, the external terminals 6a, 6b and the heat dissipating bodies 22 are arranged on the surface of the sealing portion 3. The external terminals 6b are arranged at positions located outwardly from the semiconductor chips 2a, 2b and the electronic components 20a, preferably near the semiconductor chips 2a, 2b and the electronic components 20a to surround each of the semiconductor chips 2a, 2b and the electronic components 20a. The heat dissipating body 22 is obtained by connecting the heat dissipating bodies each provided to a corresponding one of the semiconductor chips 2a, 2b and the electronic components 20a. The heat dissipating bodies 22 are each larger than a corresponding one of the semiconductor chips 2a, 2b and the electronic components 20a and are arranged to cover the back surfaces of the semiconductor chips 2a, 2b and the electronic components 20a.

Here, the second vias 5 and the external terminals 6b are shared between the semiconductor chips 2a, 2b adjacent to each other or between each of the semiconductor chips 2a, 2b and corresponding one of the electronic components 20a. More specifically, the second vias 5 and the external terminals 6b arranged near a side of the semiconductor chip 2a facing the semiconductor chip 2b serve also as the second vias 5 and the external terminals 6b arranged near a side of the semiconductor chip 2b facing the semiconductor chip 2a. Moreover, the heat dissipating body 22 corresponding to the semiconductor chip 2a and the heat dissipating body 22 corresponding to the semiconductor chip 2b are connected to the shared second vias 5 and external terminals 6b at a connecting portion between the heat dissipating bodies 22.

With this configuration, even when it is not possible to sufficiently ensure a space in which the second vias 5 and the external terminals 6b are arranged for each of the semiconductor chips 2a, 2b and the electronic components 20a due to the dimensional relationship among a substrate 1, the semiconductor chips 2a, 2b, and the electronic components 20a, the second vias 5 and the external terminals 6b can be shared by arranging the second vias 5 and the external terminals 6b in a single row between mounted components adjacent to each other.

Also in this case, the sealing portion 3, the second vias 5, the heat dissipating bodies 22, and the external terminals 6b form heat conducting paths for heat generated from the semiconductor chips 2a, 2b and the electronic components 20a. Thus, the heat can be effectively dissipated to the outside of the semiconductor device 610.

Rendering the second vias 5, the external terminals 6b, and the heat dissipating bodies 22 electrically continuous with a constant electric potential supply of the mounting substrate allows the second vias 5, the external terminals 6b, and the heat dissipating bodies 22 to serve as electric shields as well as the heat conducting paths. The second vias 5 are arranged to completely surround each of the semiconductor chips 2a, 2b and the electronic components 20a, and the heat dissipating bodies 22 are provided to cover the upper surfaces of the semiconductor chips 2a, 2b and the electronic components 20a, so that the shield effect can be further increased.

With this configuration, release of electric noise generated from the semiconductor chips 2a, 2b and the electronic components 20a to the outside of the semiconductor device 610 can be reduced. Additionally, noise from the mounting substrate and the outside of the semiconductor device 610 can be reduced, so that the semiconductor chips 2a, 2b and the electronic components 20a, 20b can be stably operated.

Seventh Embodiment

Figure 14:
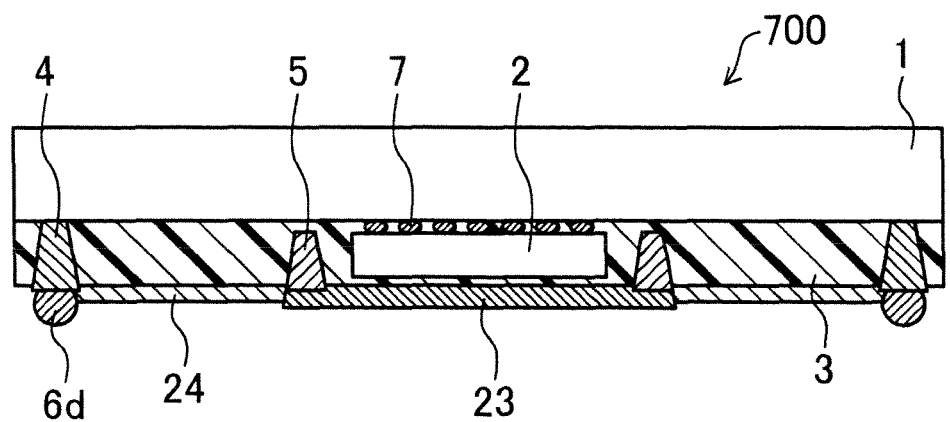
FIG. 14 is a cross-sectional view illustrating a configuration of a semiconductor device according to a seventh embodiment.
Figure 15A:
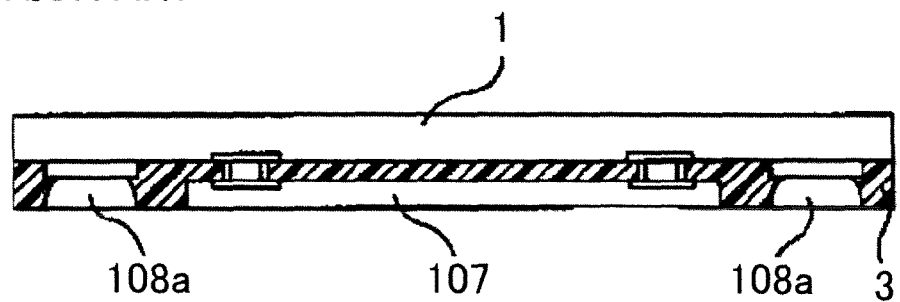
FIGS. 15A and 15B are cross-sectional views illustrating a configuration of a conventional semiconductor device.
Figure 15B:
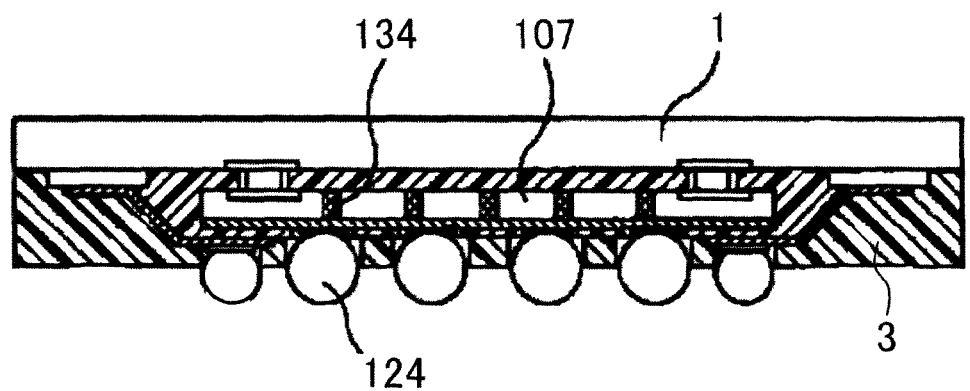

FIG. 14 is a cross-sectional view schematically illustrating a configuration of a semiconductor device 700 according to a seventh embodiment.

The first to sixth embodiments and the variations thereof each include a heat dissipating structure which is a heat conducting path including the second vias 5 and the external terminals 6b connected to the second vias 5. As illustrated in FIG. 14, in the semiconductor device 700 of the present embodiment, a heat dissipating body 23 but not external terminals is connected to second vias 5. The heat dissipating body 23 is connected to first vias 4 and external terminals 6d via a re-distribution interconnect 24 formed on a surface of a sealing portion 3.

Through holes extending in a thickness direction of the sealing portion 3 from an electrode on an upper surface of a substrate 1 to an upper surface of the sealing portion 3 are formed in the sealing portion 3. The through holes are filled with a conductive substance, thereby forming the first vias 4. That is, one end of each first via 4 is connected to the electrode on the upper surface of the substrate 1, and the other end is connected to a corresponding one of the external terminals 6d exposed from the sealing portion 3. Through this electric pathway, the function of the semiconductor chip 2 is utilized from outside of the semiconductor device 700.

Recessed portions are formed at positions located outwardly from the semiconductor chip 2, in particular, near a side surface of the semiconductor chip 2 in the sealing portion 3 in the thickness direction of the sealing portion 3 to have such a depth that the recessed portions do not reach a wiring pattern of the substrate 1. The recessed portions having such a depth that the recessed portions do not reach the wiring pattern of the substrate 1 are filled with a conductive substance, thereby forming the second vias 5.

The second vias 5 are in contact with neither the substrate 1 nor the semiconductor chip 2 and are thus insulated from the substrate 1 and the semiconductor chip 2.

The heat dissipating body 23 is formed on the surface of the sealing portion 3 to cover the semiconductor chip 2. The heat dissipating body 23 has a larger width than the semiconductor chip 2 when viewed in cross section and is connected to the second vias 5. The heat dissipating body 23 may be a metal film or a sheet having conductivity. In order to improve the heat dissipation, the heat dissipating body 23 may be a substance having high thermal conductivity.

On the surface of the sealing portion 3, the re-distribution interconnect 24 is formed outside the second vias 5. The first vias 4 and the second vias 5 are connected to and are electrically continuous with each other by the re-distribution interconnect 24. The re-distribution interconnect 24 is an interconnect. The re-distribution interconnect 24 may be a metal film or an interconnect made of copper or aluminum.

With this configuration, the heat dissipation can be further improved by a heat conducting path in which heat generated from the semiconductor chip 2 propagates via the sealing portion 3 to the second vias 5 arranged near the semiconductor chip 2 and the heat dissipating body 23 and a heat conducting path in which the heat propagates via the re-distribution interconnect 24 to the first vias 4 and the external terminals 6a.

As described above, even when no external terminals 6b is connected to the second vias 5, the heat dissipation can be improved by forming a heat conducting path by connecting the second vias 5 to the first vias 4.

Common configurations in the embodiments and the variation thereof will be additionally described in this paragraph. In the first to seventh embodiments, and the like, the mounting substrate may be a resin substrate or a ceramic substrate or may be a both-sided substrate or a multilayer substrate. Components or elements in addition to the semiconductor device may be mounted to the mounting substrate. In the first and third variations of the first embodiment, the variations of the second to fourth embodiments, the sixth embodiment and the variations of the sixth embodiment, it is not essential to connect the heat dissipating body to both of the second vias and the external terminals connected to the second vias. Even when the heat dissipating body is connected, for example, only to the second vias, a certain degree of effect can be obtained as long as the heat dissipating body is part of the heat conducting path to the external terminal. In the first and third variations of the first embodiment, the variations of the second to fourth embodiments, the sixth embodiment and the variations of the sixth embodiment, and the seventh embodiment, the heat dissipating body may be arranged on the surface of the sealing portion or may be partially embedded in the sealing portion.

The conductive substance, which is filled in the through holes to form the first vias may be the same as the conductive substance, which is filled in the recessed portions having such a depth that the recessed portions do not reach the back surface of the chip and forms the second vias and the third vias. In this case, the fabrication process is simplified. On the other hand, an optimal material for each of the substances may be selected. For example, the first vias may be filled with a conductive substance, whereas the second and third vias may be filled with an insulative material having high thermal conductivity. For example, any of alumina (aluminum oxide), aluminum nitride, and silicon carbide, or a mixture thereof can be used as the insulative material to be filled in the second and third vias. These insulative materials having high thermal conductivity may be used as a filler. Specifically, an insulative material having high thermal conductivity is powdered and mixed with a resin to obtain a mixture, and the mixture may be filled in each recessed portion. Carbon or diamond having very high thermal conductivity can be used as the filler. In this case, the second vias and the third vias filled with the filler at a high density have higher thermal conductivity than the sealing portion made of the insulative material.

In the above description, the present disclosure has been described in detail based on the embodiments and the variations thereof, wherein elements denoted by the same reference numerals have features similar to those of the preceding embodiments or variations, unless otherwise indicated. Elements denoted by the same reference numerals and structures obtained by associating the elements ensure the effect obtained in the preceding embodiments or variations, unless otherwise indicated. Moreover, the effect of the first embodiment is also ensured in the other embodiments and variations, unless otherwise indicated.

The present disclosure is not limited to the embodiments, and the like. Changes and modifications can be made as long as doing so does not depart from the spirit of the present disclosure. For example, a configuration obtained by combining the configurations of embodiments, and the like different from each other and a configuration obtained by substituting a part of an element with a similar part which is not described in the embodiments, or the like are also in the scope of the present disclosure.

The semiconductor device of the present disclosure has high heat dissipation and high noise resistance and is excellent in high frequency operation. Thus, the semiconductor device of the present disclosure is useful as RF modules, semiconductor packages, or the like of communication devices.

What is claimed is:

1. A semiconductor device comprising:
    a base having a first surface, a second surface opposite to the first surface, and electrodes on the first surface;
    a first semiconductor chip mounted to the first surface of the base;
    a sealing portion sealing the first semiconductor chip and the first surface of the base;
    a plurality of first vias penetrating the sealing portion from a surface of the sealing portion in a thickness direction of the sealing portion and each electrically connected to a corresponding one of the electrodes on the first surface of the base;
    a plurality of first external terminals provided on the surface of the sealing portion and each connected to a corresponding one of the first vias;
    a plurality of second vias located inwardly from the first vias and extending from the surface of the sealing portion in the thickness direction of the sealing portion to such a depth that the second vias do not penetrate the sealing portion; and
    a plurality of second external terminals provided on the surface of the sealing portion and each connected to a corresponding one of the second vias,
    wherein the second vias are not in contact with the first semiconductor chip.

2. The semiconductor device of claim 1, wherein
    the second vias are not in contact with the base.

3. The semiconductor device of claim 1, wherein
    the second vias are insulated from the first semiconductor chip and the base.

4. The semiconductor device of claim 1, wherein
    the first semiconductor chip includes circuit electrodes, and
    the circuit electrodes are electrically connected to corresponding electrodes of the first surface of the base via bumps, respectively.

5. The semiconductor device of claim 1, wherein
    the first semiconductor chip is mounted to the base such that a surface of the first semiconductor chip opposite to a circuit formation surface of the first semiconductor chip faces the first surface of the base, and circuit electrode formed on the circuit formation surface of the first semiconductor chip are electrically connected to corresponding electrodes on the first surface of the base via wires, respectively.

6. The semiconductor device of claim 4, wherein the second vias are arranged near a back surface of the first semiconductor chip such that one end of each second via is exposed from the sealing portion, and the other end of each second via faces the back surface.

7. The semiconductor device of claim 1, wherein the second vias are arranged near a side surface of the first semiconductor chip.

8. The semiconductor device of claim 1, wherein the second vias are arranged to surround the first semiconductor chip.

9. The semiconductor device of claim 1, further comprising:
a first heat dissipating body provided on the surface of the sealing portion opposite to the base, wherein
the first heat dissipating body is connected to the second vias or the second external terminals.

10. The semiconductor device of claim 1, further comprising:
a second heat dissipating body provided in the sealing portion and being in contact with a back surface of the first semiconductor chip, wherein
the second heat dissipating body is connected to the second vias.

11. The semiconductor device of claim 9, wherein the first heat dissipating body is arranged to cover a back surface of the first semiconductor chip and has a larger area than the back surface of the first semiconductor chip when viewed in plan.

12. The semiconductor device of claim 9, wherein the first heat dissipating body is made of a conductive material.

13. The semiconductor device of claim 4, wherein an opening is formed in the sealing portion to expose part of a back surface of the first semiconductor chip.

14. The semiconductor device of claim 13, further comprising:
a heat dissipating body provided in the opening in the sealing portion and being in contact with the back surface of the first semiconductor chip.

15. The semiconductor device of claim 9, further comprising:
a second semiconductor chip mounted to the first surface of the base and sealed with the sealing portion; and
a third heat dissipating body provided on the surface of the sealing portion opposite to the base and covering a back surface of the second semiconductor chip, wherein
the second vias are arranged near a side surface of the second semiconductor chip to surround the second semiconductor chip and are connected to the third heat dissipating body.

16. The semiconductor device of claim 15, further comprising:
a first electronic component mounted to the first surface of the base and sealed with the sealing portion.

17. The semiconductor device of claim 16, further comprising:
a fourth heat dissipating body provided on the surface of the sealing portion opposite to the base and covering a back surface of the first electronic component, wherein the second vias are arranged near a side surface of the first electronic component to surround the first electronic component and are connected to the fourth heat dissipating body,
the first semiconductor chip is adjacent to the second semiconductor chip, and the second semiconductor chip is adjacent to the first electronic component,
the second vias and the second external terminals are shared on a side where the first semiconductor chip and the second semiconductor chip face each other, and the second vias and the second external terminals are shared on a side which the second semiconductor chip and the first electronic component face each other, and
the first heat dissipating body, the third heat dissipating body, and the fourth heat dissipating body are connected to each other.

18. A semiconductor device comprising:
a base having a first surface, a second surface opposite to the first surface, and electrodes on the first surface;
a first semiconductor chip mounted to the first surface of the base;
a sealing portion sealing the first semiconductor chip and the first surface of the base;
a plurality of first vias penetrating the sealing portion from a surface of the sealing portion in a thickness direction of the sealing portion and each electrically connected to a corresponding one of the electrodes on the first surface of the base;
a plurality of external terminals provided on the surface of the sealing portion and each connected to a corresponding one of the first vias;
a plurality of second vias located inwardly from the first vias and extending from the surface of the sealing portion in the thickness direction of the sealing portion to such a depth that the second vias do not penetrate the sealing portion; and
a heat dissipating body arranged on the surface of the sealing portion opposite to the base, the fifth heat dissipating body being connected to the second vias; and
a conductive re-distribution interconnect layer connecting the first vias to the second vias, wherein
the second vias are out of contact with the first semiconductor chip.

19. A semiconductor device assembly comprising:
a mounting substrate having a surface on which a wiring pattern and electrodes are formed; and
the semiconductor device of claim 1 mounted to the mounting substrate, wherein
at least one of the first external terminals and the second external terminals of the semiconductor device is electrically connected to at least one of the electrodes of the mounting substrate, the electrodes being fixed at a constant electric potential.

20. A semiconductor device assembly comprising:
a mounting substrate having a surface on which a wiring pattern and electrodes are formed; and
the semiconductor device of claim 18 mounted to the mounting substrate, wherein
at least one of the external terminals of the semiconductor device is electrically connected to at least one of the electrodes of the mounting substrate, the electrodes being fixed at a constant electric potential.

* * * * *